(12) United States Patent
Mahajan et al.

(10) Patent No.: US 6,188,242 B1
(45) Date of Patent: Feb. 13, 2001

(54) VIRTUAL PROGRAMMABLE DEVICE AND METHOD OF PROGRAMMING

(75) Inventors: Shekhar Y. Mahajan, Sunnyvale; Wenyi Shao, Union City, both of CA (US)

(73) Assignee: QuickLogic Corporation, Sunnyvale, CA (US)

(*) Notice: Under 35 U.S.C. 154(b), the term of this patent shall be extended for 0 days.

(21) Appl. No.: 09/343,980

(22) Filed: Jun. 30, 1999

(51) Int. Cl.[7] .................................................. H03K 19/177
(52) U.S. Cl. ............................ 326/41; 326/49; 365/225.7
(58) Field of Search .................................. 326/41, 38, 39; 365/185.04, 225.7

(56) References Cited

U.S. PATENT DOCUMENTS

| | | | |
|---|---|---|---|
| 5,424,655 | 6/1995 | Chua | 326/40 |
| 5,479,113 | * 12/1995 | Gamal et al. | 326/41 |
| 5,526,276 | 6/1996 | Cox et al. | 364/489 |
| 5,544,070 | 8/1996 | Cox et al. | 364/489 |
| 5,552,720 | 9/1996 | Lulla et al. | 326/38 |
| 5,572,707 | * 11/1996 | Rozman et al. | 326/38 |
| 5,661,412 | 8/1997 | Chawla et al. | 326/38 |
| 5,687,325 | 11/1997 | Chang | 395/284 |
| 5,729,468 | 3/1998 | Cox et al. | 364/489 |
| 5,744,979 | * 4/1998 | Goetting | 326/41 |
| 5,861,761 | * 1/1999 | Kean | 326/41 |
| 6,026,016 | * 2/2000 | Gafken | 365/185.04 |
| 6,031,757 | * 2/2000 | Chuang et al. | 365/185.04 |

OTHER PUBLICATIONS

Wong, et al., "Conducting Filament of the Programmed Metal Electrode Amorphous Silicon Antifuse", presented at the International Electron Devices Meeting, pp. 6–3 through 6–18 (1993).

Actel Corporation, "Switching Elements, The Key to FGPA Architecture", pp. 3–1 through 3–94 and 4–1 through 4–56 (May 1995).

Actel Corporation, "FPGA Data Book and Design Guide, Field Programmable Gate Arrays", pp. 1–153 through 1–222 (May 1995).

Actel Corporation, "FPGA Data Book and Design Guide, Field Programmable Gate Arrays", pp. 1–51 through 1–101 including cover and copyright page, (1995).

Quick Logic, "Very–High Speed–FPGA's Through Technology, Architecture, and Tools", pp. 1–5 through 2–16, (1995).

Stephen D. Brown et al., "Field–Programmble Gate Arrays", Chapter 1, pp. 1–43, (1992).

Stephen D. Brown et al., "Field–Programmable Gate Arrays", Chapter 4, pp. 88–202 including cover and copyright page, (1992).

* cited by examiner

*Primary Examiner*—Tan T. Nguyen
(74) *Attorney, Agent, or Firm*—Skjerven Morrill MacPherson LLP; Alan H. MacPherson; Michael J. Halbert

(57) ABSTRACT

A programmable device, such as a field programmable gate array, includes at least one signature bit that is used to indicate whether the programmable device has fewer than all the logic blocks accessible to the user. The signature bit may be programmed after the manufacture of the programmable device or may be hard wired during the manufacture of the device. The programming unit recognizes the configuration of the signature bit and restricts access to particular logic blocks based on the configuration. Thus, a large programmable unit may become a smaller "virtual" programmable device by altering the configuration of the signature bit, which is recognized by the programming unit. Consequently, the manufacturer may test market programmable devices of differing sizes to determine demand without incurring the costs associated with producing a completely new product line.

19 Claims, 6 Drawing Sheets

VIRTUAL PROGRAMMABLE DEVICE AND METHOD OF PROGRAMMING

FIELD OF THE INVENTION

The present invention relates to a programmable device, such as a field programmable gate array, and in particular to a programmable device and a method of programming that permits the functional size of the programmable device to be altered.

BACKGROUND

Programmable devices, such as programmable logic arrays or field programmable gate arrays, are well known in the art. These devices offer high performance and flexibility of design for the user. Programmable devices typically consist of many repeated portions or "macrocells," which include modules of logic elements and programmable interconnect structures. The logic elements and programmable interconnect structures may be programmed to be interconnected in various configurations as desired by the user.

FIG. 1 shows a schematic view of a conventional programmable device 10. Programmable device 10 is shown with five rows and five columns logic elements, referred to herein as logic blocks 12, and a plurality of interconnecting conductors 14, shown schematically as lines. Of course, conventional programmable devices typically have many more logic blocks than shown in FIG. 1. A plurality of input/output ("I/O") pins 16 are also shown in FIG. 1. Conductors 14 are connected to programmable antifuses (not shown) that may be programmed to interconnect particular logic blocks 12 and I/O pins 16 in various configurations as desired by the user.

To configure a programmable device, the user configures the interconnect structures, i.e., conductors 14 and antifuses (not shown) so that selected input terminals and selected output terminals of selected on-chip circuit components, i.e., logic blocks 12, are electrically connected together in such a way that the resulting circuit is the user-specific circuit desired by the user. In a programmable device employing, for example, amorphous silicon antifuses, selected amorphous silicon antifuses disposed between selected wire segments are "programmed" to connect the selected wire segments together electrically. Which antifuses are programmed and which antifuses are left unprogrammed determines how the circuit components are interconnected and therefore determines the resulting circuit.

A field programmable gate array (an "FPGA") is one type of programmable device. For background information on field programmable gate arrays that employ antifuses, see: "Field Programmable Gate Array Technology" edited by Stephen Trimberger, 1994, pages 1–14 and 98–170; "Field-Programmable Gate Arrays" by Stephen Brown et al., 1992, pages 1–43 and 88–202; "Practical Design Using Programmable Logic" by David Pellerin and Michael Holley, 1991, pages 84–98; the 1995 QuickLogic Data Book, 1995, pages 1–5 through 2–11 and 6–3 through 6–18; the 1998 QuickLogic Data Book, 1998, pages 1–5 through 2–16; the 1995 Actel FPGA Data Book and Design Guide, 1995, pages ix–xv, 1–5 through 1–34, 1–51 through 1–101, 1–153 through 1–22, 3–1 through 4–56; U.S. Pat. No. 5,424,655 entitled "Programmable Application Specific Integrated Circuit Employing Antifuses and Methods Therefor". The contents of these documents are incorporated herein by reference.

Currently, programmable devices are available in many different sizes, i.e., with a different number of logic blocks 12, each size being a separate product line. For example, programmable devices are available with as many as 1584 logic blocks 12 and as few as 96 logic blocks 12. Thus, a user may purchase large programmable devices or smaller programmable devices depending on the desired application.

As with any silicon device, programmable devices are costly to design and manufacture. Each different product line of programmable devices requires a different design and specialized tooling, such as masks. Thus, every time a manufacturer creates a different sized programmable device, the manufacturer must incur the expense of engineering, designing, and tooling the new device. Moreover, producing a new product line is time consuming. A period of several months or longer may pass between the decision to produce a different sized programmable device and the actual production of that device.

Unfortunately, the manufacturer does not always know if there is an adequate demand for a new product line. Moreover, while there may be some demand for the product, the demand may be too small for the manufacturer to recoup the costs that are incurred in producing an entirely new product line. Thus, the manufacturer may incur the costs of producing a new product line that does not have enough demand to support it. Further, if there is a high demand for a different sized programmable device, considerable time may be spent by the manufacturer in evaluating the market demand, designing, and producing the new product line. Consequently, the manufacturer may lose valuable market share.

Thus, there is a need for a programmable device and a method of programming so that a single programmable device may be easily and quickly converted to different product lines.

SUMMARY

A programmable device, in accordance with an embodiment of the present invention, includes signature bits that indicate whether the device is a "virtual" programmable device, wherein a virtual programmable device has fewer than all the logic blocks accessible to the user. Thus, a virtual programmable device is functionally smaller than the base programmable device, i.e., the programmable device when it is not a virtual device. A single programmable device may be used in different product lines. A data file corresponding to the signature bits identifies whether all the logic blocks or fewer than all the logic blocks may be used when the user maps the desired circuit on the virtual programmable device.

The signature bits may be programmed by the manufacturer after the programmable device is manufactured. In another embodiment, the signature bits are hard wired during the manufacture of the programmable device. Thus, the manufacturer may produce different sized programmable devices by simply altering the signature bit. Consequently, the manufacturer is not required to design and generate separate tooling for each new product line. Further, the manufacturer may easily control inventory by appropriately programming the signature bits.

The programming process of the programmable device uses a programming unit that identifies the configuration of the signature bit. The mapping software limits the number of logic blocks that may be used. Programming of the programmable device is conventionally performed, except that (depending on whether the device is a virtual device) not all the logic blocks may be accessed. After identifying the signature bits, the programming unit ensures that the restricted logic blocks in a virtual programmable device are not used.

In addition, during the placement process the user typically maps a desired design onto the programmable device. To prevent user confusion regarding how many and which logic blocks are accessible, the users, view of the programmable device does not include the restricted logic blocks. Thus, the user is presented with a view of the programmable device that is uncluttered with inaccessible logic blocks, routing resources, and I/O cells (associated with I/O pins). The users' view of the virtual programmable device will show the device as actually having fewer logic blocks. The mapping of the design onto the programmable device by the user is conventionally stored on a file which is downloaded to the programming unit. The programming unit then programs the programmable device in accordance with the mapping file.

DETAILED DESCRIPTION

Figure 2:
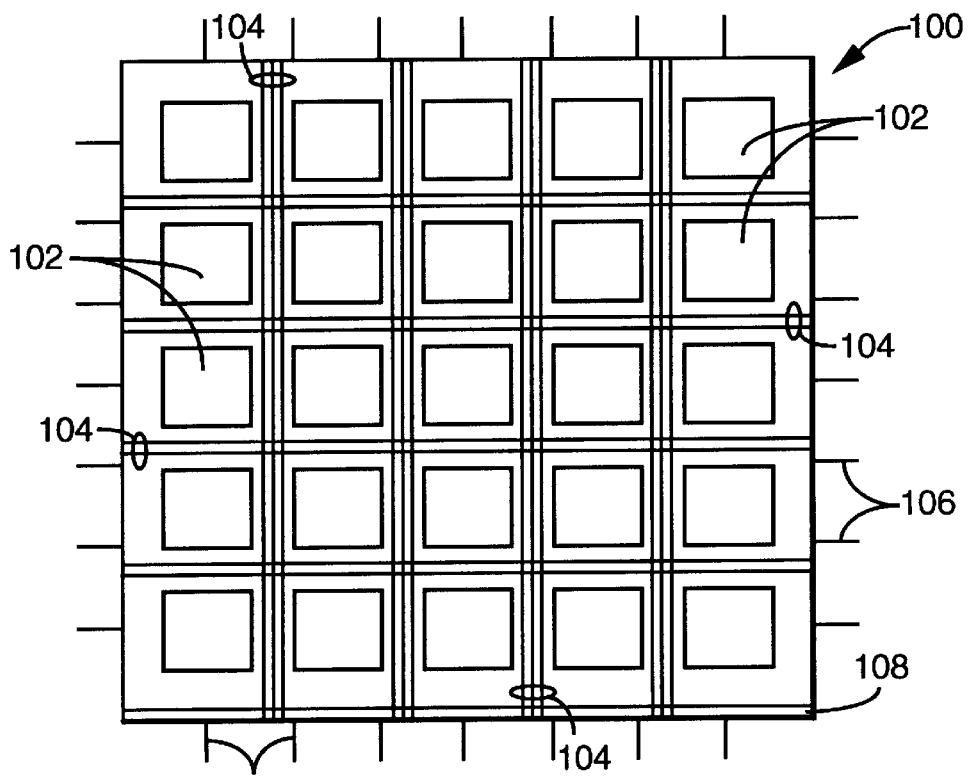
FIG. 2 shows a schematic view of a programmable device with signature bits in accordance with an embodiment of the present invention.

FIG. 2 shows a schematic view of a programmable device 100 having signature bits 108. Programmable device 100 may be used as the base for multiple product lines of programmable devices having different (smaller) sizes in accordance with an embodiment of the present invention. Each smaller sized programmable device is physically the same size, i.e., the size of the chip is the same, but functionally smaller than the base device, and is therefore referred to herein as a "virtual" programmable device. Thus, the functional size of the programmable device 100 may be altered by appropriately programming the programmable device and its signature bits 108.

Figure 1:
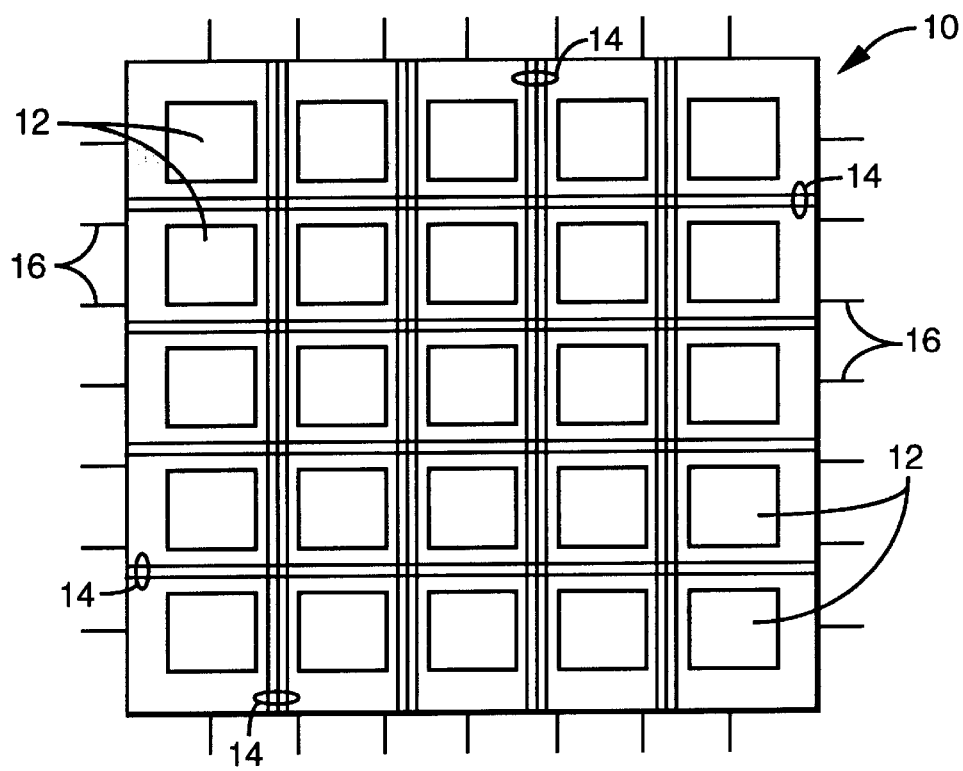
FIG. 1 shows a schematic view of a conventional programmable device with a plurality of logic blocks and interconnecting conductors.

As shown in FIG. 2, programmable device 100 has a plurality of logic blocks 102, a plurality of interconnecting conductors 104 and I/O pins 106 with associated I/O cells (not shown). It should be understood that programmable device 100 may also include other circuits, such as Read Access Memory (RAM) circuits. Similar to programmable device 10 shown in FIG. 1, the conductors 104 of programmable device 100 are connected to programmable antifuses (not shown) that are programmed by the user to interconnect particular logic blocks 102 and I/O pins 106 in various configurations. Programmable device 100 may be, for example, a conventional field programmable gate array, such as the type disclosed in U.S. Pat. No. 5,424,655, which is incorporated herein by reference. However, unlike conventional programmable devices, particular logic blocks 102, associated routing resources, i.e,. interconnecting conductors 104, and particular I/O pins 106 in programmable device 100 may be rendered inaccessible to the user resulting in a functionally smaller programmable device. Further, if programmable device 100 includes other types of circuits, such as RAM circuits, a number of these circuits may be rendered inaccessible to the user.

It should be understood that the specific number of logic blocks 102 shown in FIG. 2 is for the sake of simplicity and that programmable device 100 may have many more logic blocks 102. In addition, programmable device 100 may have many more I/O pins than shown in FIG. 2.

The specific number of logic blocks 102 in programmable device 100 that are accessible to the user is changeable. Thus, programmable device 100 may be used in a product line in which all the logic blocks 102 are accessible, i.e., the base device. Programmable device 100 may also be used in a product line that has fewer than all the logic blocks accessible, i.e., a virtual device. The user may be restricted from using certain logic blocks in the programmable device, along with associated routing resources and I/O pins.

Figure 3:
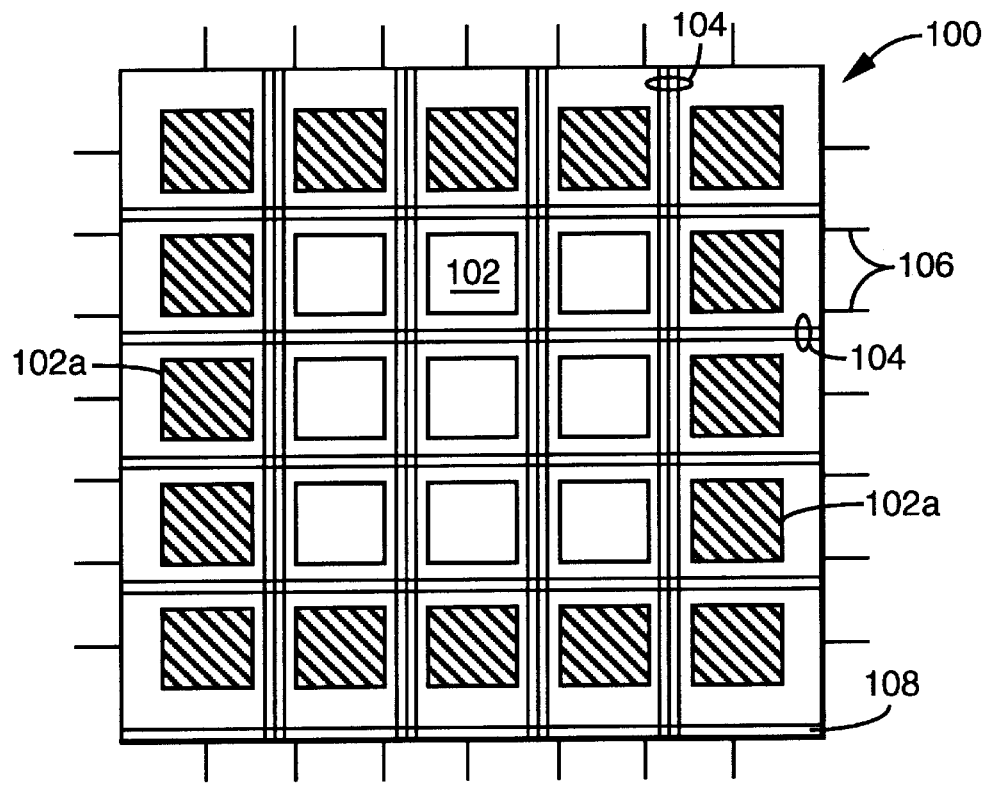
FIG. 3 shows a virtual programmable device, which has the same number of logic blocks as the programmable device shown in FIG. 2, except that certain logic blocks in the virtual programmable device are restricted from use.

FIG. 3 shows a virtual programmable device 100a. Programmable device 100, shown in FIG. 2, acts as the base for virtual programmable device 100a, and thus virtual programmable device 100a physically has the same number of logic blocks as programmable device 100. However, as indicated by shading, certain logic blocks 102a are restricted, i.e., inaccessible to the user, along with associated routing resources and I/O pins 106, and thus virtual programmable device 100a is functionally smaller than programmable device 100. It should be understood that the number and location of restricted logic blocks 102a are exemplary, and that in accordance with the present invention virtual programmable device 100a may have any number of restricted logic blocks 102a in any position.

Consequently, in accordance with the present invention, a single relatively large programmable device may be used as a base for many different product lines of smaller programmable devices. Thus, advantageously, the manufacturer is not required to design and manufacture separate programmable devices for each product line. Further, the manufacturer may easily control inventory by configuring a number of base devices 100 to virtual devices 100a as needed.

As shown in FIG. 2, programmable device 100 includes signature bits 108 that indicate whether the device is a virtual programmable device. Thus, for example, signature bits 108 may identify a desired part number. During programming, the part number is used by the mapping software to identify the number and/or the location of logic blocks that are accessible or restricted in accordance with an embodiment of the present invention. Alternatively, signature bits 108 may directly identify the particular logic blocks 102 that are to be accessible or restricted from use. In either case, signature bits 108 are said to identify the programmable device 100 as a virtual or as a base device.

Signature bits 108 are programmable so that the number of logic blocks accessible to the user may be determined after manufacture of the programmable device 100. Alternatively, signature bits 108 are hardwired into the chip during manufacture, and thus the determination of the number of logic blocks accessible to the user is made during manufacture.

The configuration of signature bits 108 is used to identify whether the programmable device 100 is virtual, i.e., fewer than all the logic blocks are accessible. Thus, signature bits 108 will have one configuration for a base programmable device 100 that utilizes all of the logic blocks 102 and a different configuration for a virtual programmable device 100a that has restricted logic blocks 102a.

Figure 4:
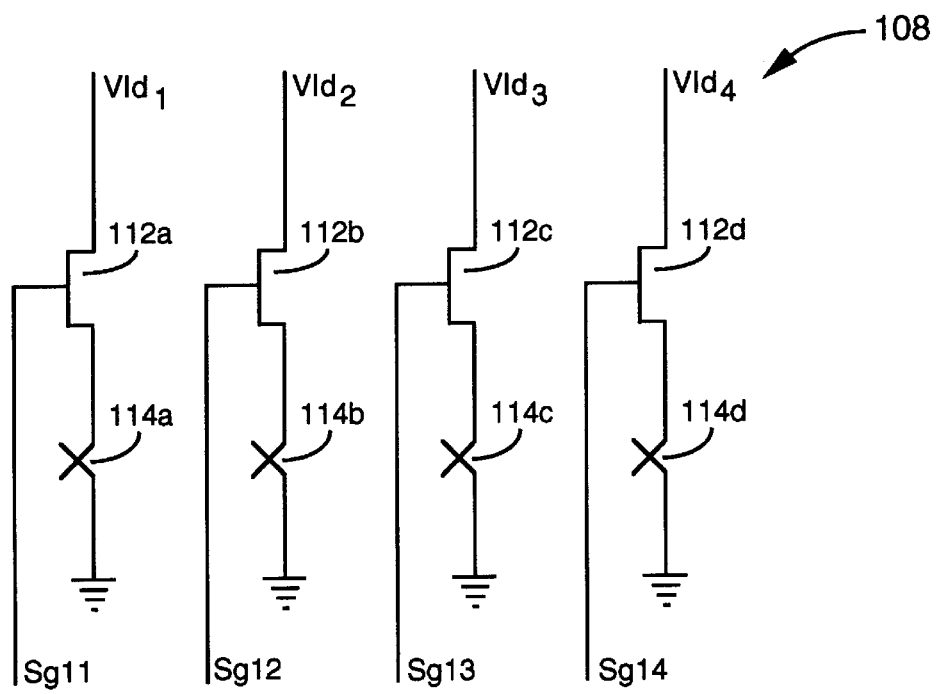
FIG. 4 shows a schematic view of programmable signature bits.

FIG. 4 shows a schematic view of programmable signature bits 108, in accordance with an embodiment with the present invention. As shown in FIG. 4, signature bits 108 include four transistors 112a, 112b, 112c, and 112d, each coupled to a valid line, i.e., vld1, vld2, vld3, and vld4, respectively, and coupled to a ground reference voltage through programmable antifuses 114a, 114b, 114c, 114d, respectively. The gate of each transistor is coupled to a signature line, sgl1, sgl2, sgl3, and sgl4, respectively. As is well understood in the art, antifuses 114a–114d act as insulators until programmed and then will act as conductors. Thus, signature bits 108 may be programmed with different configurations by programming any number of antifuses 114a–114d. An individual signature bit is programmed by applying a high voltage on the appropriate valid line, e.g., vld1, and turning on the appropriate signature line, e.g., sgl1, to program the antifuse, e.g., 114a. The conductance at the valid line, e.g., vld1, is measured to determine if that signature bit is programmed, i.e., a "1", or not, i.e., a "0". Antifuses 114a–114d may be programmed by the manufacturer in a conventional fashion.

It should be understood that while FIG. 4 shows signature bits 108 as including four bits, signature bits 108 may have any number of bits, for example, between one and thirty-two bits. Further, it should be understood that alternative devices may be used as individual signature bits, including fuses, and appropriate memory devices, such as EPROMS.

Moreover, while signature bits 108 are shown as programmable in FIG. 4, it should be understood that signature bits 108 may be hardwired by placing the desired valid lines in electrical contact with a ground reference voltage in the desired configuration during the manufacture of programmable device 100. This may be done, for example, using a different mask for each desired configuration of signature bits 108.

By way of an example, a specific four bit configuration ("0000") of signature bits 108 may be used to identify a base programmable device 100 in which the user will have access to all the logic blocks 102. However, the signature bits 108 may be altered to a different configuration ("1000") to identify virtual programmable device 100a, shown in FIG. 3, in which fewer than all the logic blocks may be accessed by the user. Different configurations of signature bits 108 may be used to identify a number of different virtual programmable devices having different numbers of logic blocks restricted. In some embodiments, the specific configuration of signature bits 108 may be used to identify specific columns and/or rows of logic blocks, groups of logic blocks, as well as individual logic blocks, that are restricted, i.e., inaccessible to the user.

Because signature bits 108 use antifuses, once a bit is programmed it may not be unprogrammed. However, in accordance with the present invention, a single product line may be identified with multiple configurations of the signature bits 108. For example, the signature bits 108 in a base programmable device 100 may have a configuration of "0000" as well as "1111". Thus, if signature bits 108 have been programmed so as to have a "1000" configuration identifying the device as virtual programmable device 100a, shown in FIG. 3, the signature bits 108 may be altered by subsequent programming so that the configuration is "1111" identifying the device as base programmable device 100, shown in FIG. 2. Further, the signature bits 108 may be programmed multiple times to identify the device as different virtual programmable device, i.e., with different numbers of logic blocks accessible.

It should be understood that programming the signature bits 108 is done by the manufacturer and is separate from the actual programming of the programmable device 100 itself. Thus, even if signature bits 108 are programmed to identify the device as virtual programmable device 100a, the device itself is still unprogrammed. Consequently, logic blocks 102 and restricted logic blocks 102a are unprogrammed and thus physically indistinguishable. Until the user programs the device, a programmable device 100 and a virtual device 100a are physically the same except for the configuration of the signature bits 108.

Figure 5:
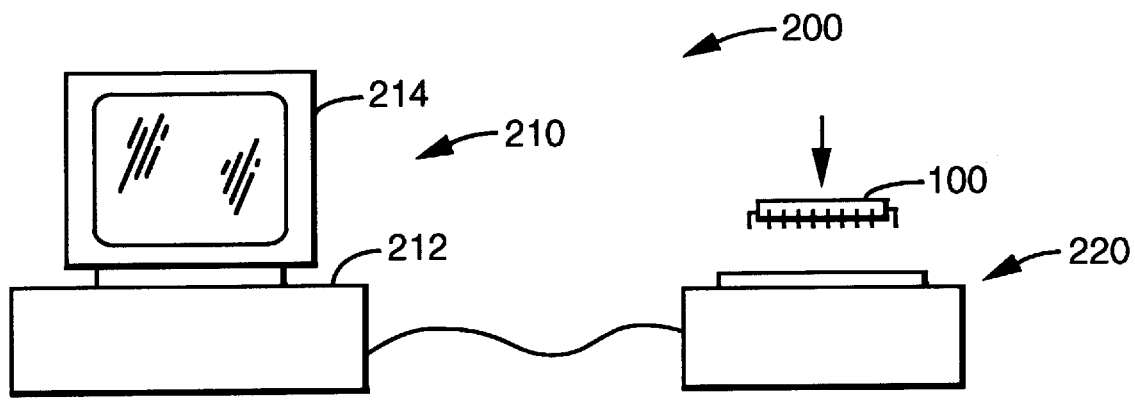
FIG. 5 is a programming device including a computer for mapping the desired design onto the programmable device and a programming unit for programming the programmable device.

FIG. 5 shows a simplified view of a programming apparatus 200 which is used to program programmable device 100. As shown in FIG. 5, programming apparatus 200 includes a computer 210 and a programming unit 220. Computer 210 includes a microprocessor 212 and a monitor 214 and is used by the user to map a desired design onto the programmable device 100. Computer 210 may be a conventional personal computer, while programming unit 220 is, for example, a DeskFab™ unit sold by QuickLogic, Inc., located in Sunnyvale, Calif. Computer 210 is shown physically connected to programming unit 220, however, it should be understood that in one embodiment computer 210 and programming unit 220 may be stand alone units and communicate via appropriate memory media, such as floppy disk or CD ROM. A programmable device 100 is shown in FIG. 5, in a side view, being inserted into programming unit 220.

The particular methods used to program a programmable device 100 depends on the type and manufacture of programming device 100. However, the general operation and processes used by programming apparatus 200 to program a programmable device 100 with a users' desired design is well known to those of ordinary skill in the art. For more information related to programming programmable devices see: U.S. Pat. No. 5,552,720, entitled "Method for Simultaneous Programming of Multiple Antifuses," issued Sep. 3, 1996; U.S. Pat. No. 5,544,070, entitled "Programmed Programmable Device and Method for Programming Antifuses of a Programmable Device," issued Aug. 6, 1996; U.S. Pat. No. 5,661,412, entitled "Reducing Programming Time of a Field Programmable Gate Array Employing Antifuses," issued Aug. 26, 1997; U.S. Pat. No. 5,526,276, entitled "Select Set-Based Technology Mapping Method and Apparatus," issued Jun. 11, 1996, and U.S. Pat. No. 5,729,468, entitled "Reducing Propagation Delays in a Programmable Device," issued Mar. 17, 1998, all of which are incorporated herein by reference.

In general, when a user desires to program a programmable device 100 with a desired design, the user maps the desired design onto a software model of the programmable device 100 with computer 210 using appropriate software, which is well known to those of ordinary skill in the art. For example, computer 210 may use software such as QuickWorks™, produced by QuickLogic, so that the user may map a desired design onto a model of the programmable device 100. During this process, the user is typically presented with a view of the model of the programmable device via monitor 214.

Figure 6:
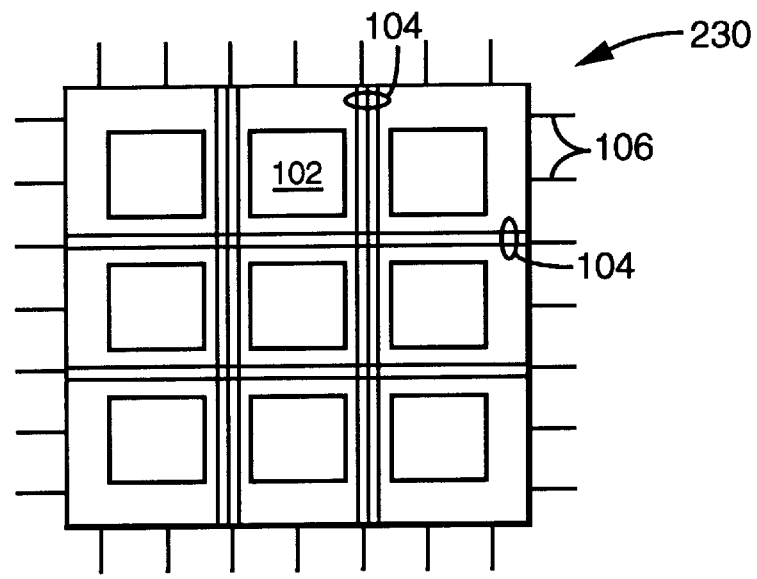
FIG. 6 shows the users' view of the virtual programmable device as the user maps the desired design onto the programmable device.

However, in accordance with the present invention, when the user is mapping a design onto virtual programmable device 100a, there are certain logic blocks 102a that are inaccessible to the user. To avoid confusion about which logic blocks are accessible and which are not during the mapping process, monitor 214 will present the user with a view of a model of the programmable device having only accessible logic blocks 102. The users' view of the programmable device will not include gaps or any other indication that there are logic blocks physically present in the device, but that are inaccessible. FIG. 6 shows the user's view 230 of a model of a virtual programmable device 100a as shown on monitor 214 in accordance with an embodiment of the present invention. As can be seen in FIG. 6, only the accessible logic blocks 102 and interconnecting conductors 104 are shown in the user's view 230 of virtual programmable device 100a. If fewer than all the I/O pins 106 are accessible, only the accessible pins are shown in users's view 230. As can be seen in FIG. 6, no large gaps are shown to indicate the absence of restricted logic blocks 102a. Moreover, signature bits 108 need not be shown in the user's view 230 because signature bits 108 are not programmed by the user.

Because the process of mapping the desired design onto a model of virtual programmable device 100a on computer 210 is done in software and does not require the actual presence of virtual programmable device 100a, the computer 210 will not have access to signature bits 108. Consequently, it is necessary for computer 210 to recognize the product line and whether the product is a virtual device. Thus, an identifier, such as the part number, is used to identify the programmable device as a virtual device.

Figure 7:
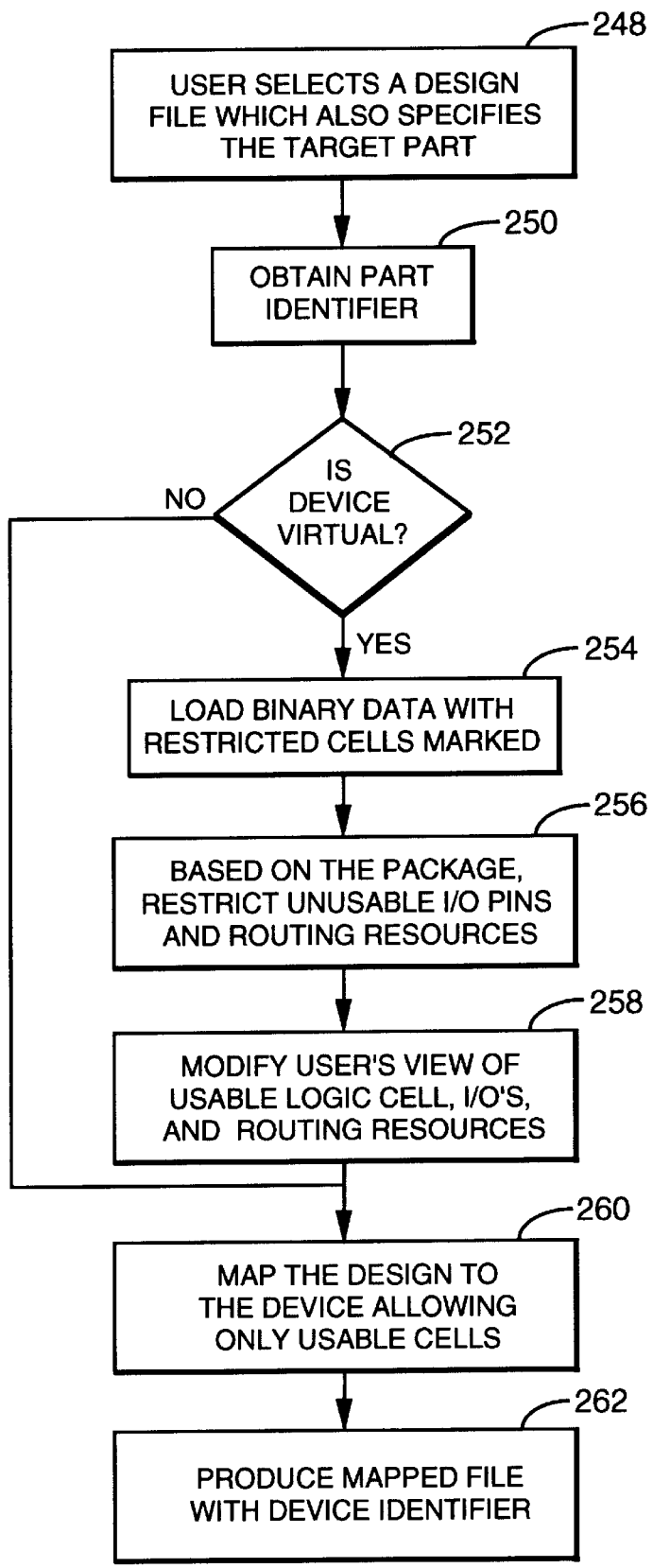
FIG. 7 is a flow chart showing the mapping process including identifying the programmable device as "virtual," limiting the mapping of the desired device to specific logic blocks, and modifying the users' view.
Figure 7A:
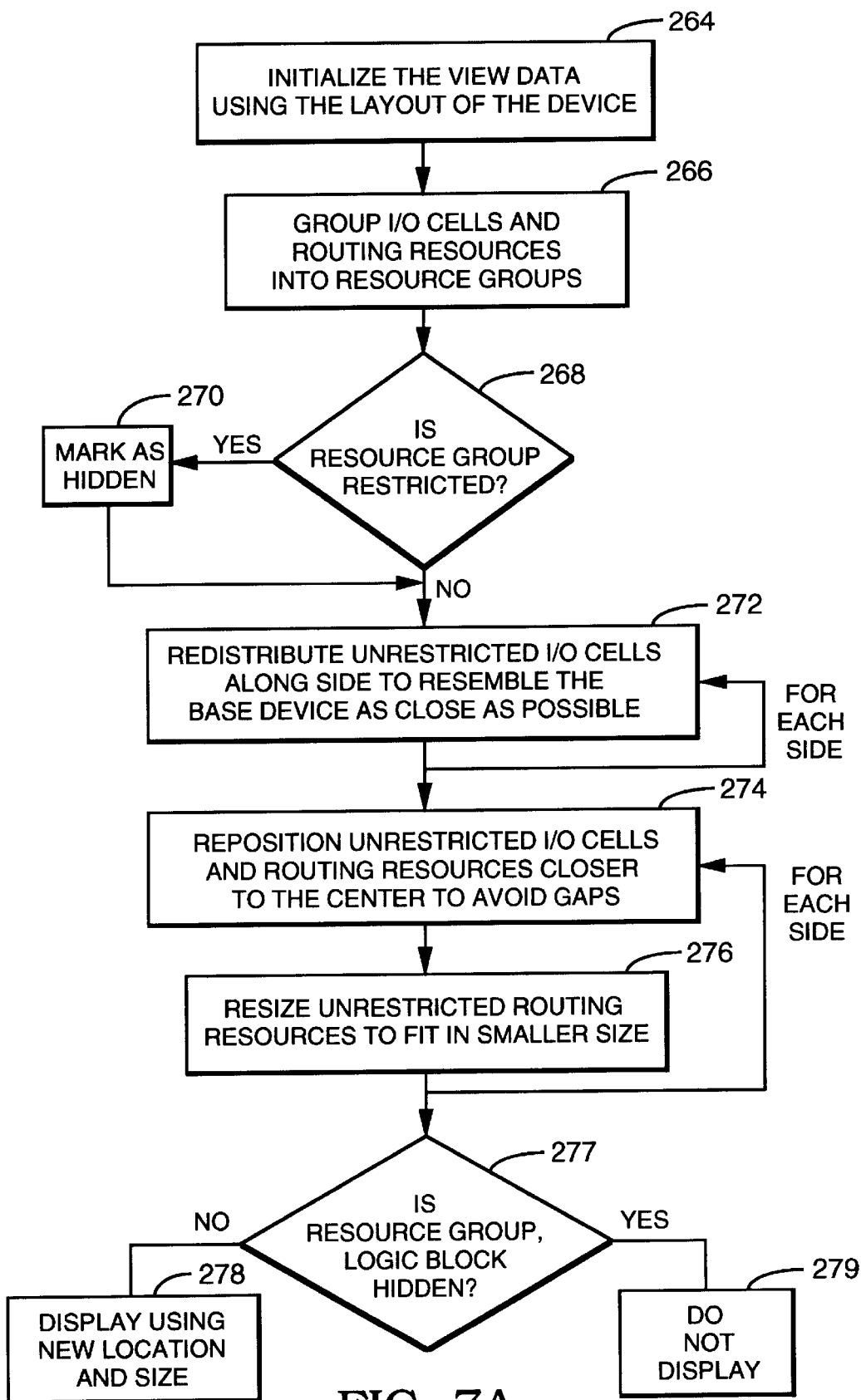
FIG. 7A is a flow chart showing the process of restricting unusuable I/O pins 106 and routing resources and modifying the user's view.

FIGS. 7 and 7A are flow charts showing the process of identifying the programmable device as virtual and limiting the mapping of the desired device to specific logic blocks and modifying the users' view 230 accordingly. As shown in FIG. 7, in step 248 the user selects a design file, which also specifies the target part. In step 250 a part identifier is obtained. This may be accomplished, for example, by the user inputting the device part number into the computer 210. Using the identifier, the next step 252 is to determine if the programmable device is virtual. If the device is not virtual, the process flows to step 260, where the design is mapped to the device using only usuable cells, which in the non-virtual case is all the cells. The user is permitted to map the desired design onto the programmable device in a conventional fashion.

If, however, the identifier indicates that the device is virtual in step 252, the process then loads binary data with the restricted cells marked in step 254. This restricts the unusable logic blocks 102a from mapping. In step 256, the unusuable I/O pins 106 and routing resources, i.e., interconnecting conductors 104, are restricted. In step 258, the mapping program modifies the users' view 230 so that only the usable logic blocks (as indicated from step 254) and the ususable I/O pins 106 and routing resources (as indicated from step 256) are shown. The process then flows to step 260, where the desired design is mapped onto only the usable logic blocks 102 of the virtual programmable device 100a in a conventional fashion. The mapping of the desired design onto virtual programmable device 100a is conventional. In step 262, a mapped file is produced that records the mapping of the design onto virtual programmable device 100a and that includes the part identifier.

FIG. 7A is a flow chart showing the process of restricting unusuable I/O pins 106 and routing resources and modifying the user's view as indicated in steps 256 and 258 of FIG. 7. As shown in step 264 in FIG. 7A, first the view data is initialized using the layout of the base device. In step 266, I/O cells (not shown), which are associated with I/O pins 106, and routing resources are devided into resource groups. The groups, for example, may be formed based on the side of the device, i.e., right, left, top, and bottom, that the I/O cells and routing resources are found.

In step 268 it is determined if the each resource group is restricted or not. If a resource group is restricted for use, the resource group is marked as hidden in step 270. Once the resource groups is marked as hidden or if the resource group is not restricted, the process flows to step 272.

In step 272 the I/O cells in each unrestricted group is redistributed along the sides of the device so that the virtual device resembles the base device as close as possible. Thus, if the virtual device has fewer I/O cells (and associated I/O pins 106) accessible to the user than the base device, the unrestricted I/O cells are distributed to all the sides of the virtual device so that the user will be restricted from a large number of pins on only one side.

In step 274 the I/O cells and routing resources that are not restricted, i.e., are within unmarked resource groups, are repositioned closer to the center of the device so that there will be no gaps apparent to the user. The unrestricted routing resources are resized so that they fit within the smaller virtual device view in step 276. Steps 274 and 276 are performed for each resource group for each side of the device.

In step 277 it is determined if the resource group or logic blocks are marked as hidden. If the resource group or logic blocks are marked as hidden, they are not displayed, as shown in step 279. However, if resource group or logic blocks are not marked as hidden, they are displayed using the new location and size of the I/O cells and routing resources as shown in step 278.

Figure 8:
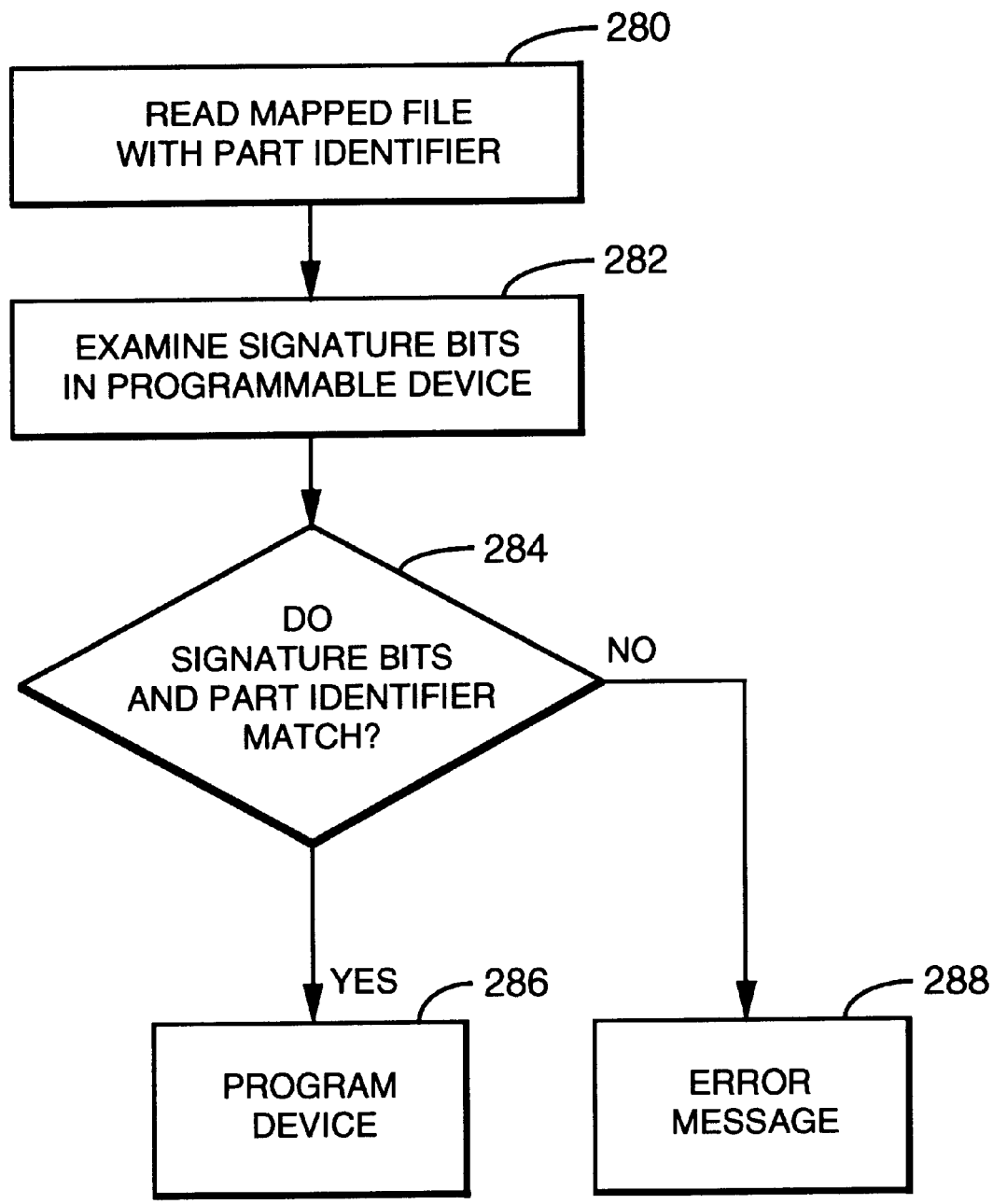
FIG. 8 is a flow chart showing the programming process including identifying the programmable device as virtual and restricting the logic blocks that may be used.

Once the user maps the desired design onto the programmable device, the mapped file is transferred to the programming unit 220 to actually program the programmable device. FIG. 8 is a flow chart showing the process of identifying the programmable device as virtual and programming the device according to the mapped file produced in step 262 of FIG. 7. As shown in FIG. 8, in step 280 programming unit 220 reads the mapped file with the desired design from step 262 and the part identifier. Programming unit 220 examines the configuration of signature bits 108 on programmable device 100 in step 282. Next, in step 284 programming unit 220 determines if the configuration of the signature bits 108 on programmable device match the part identifier in the mapped file. If the configuration of the signature bits 108 match the part identifier, programming unit 220 programs the device in step 286. Programming unit 220, which may be for example, QuickPro TM to program the programmable device, may program the device in a conventional manner based on the mapped file, as is well understood by those of ordinary skill in the art. If, however, the configuration of the signature bits 108 and the part identifier do not match, an error message is produced in step 288 and the device is not programmed.

It should be understood that the present invention may be implemented without signature bits 108. Thus, when the user maps the design onto the programmable device, the part number or another identifier is used to restrict the logic blocks 102a that may be programmed. The programming unit 220 then programs the programmable device 100 in accordance with the map, and thus does not need signature bits 108. However, if an incorrect identifier is used during the mapping process, the user will have access to a greater number of logic blocks 102 than is intended.

In addition, if desired, the users' view 230 may show gaps or another type of indication that the virtual programmable device 100a has unusable logic blocks 102a.

Use of a virtual programmable device 100a, permits several product lines to be generated from a single programmable device 100. Thus, a manufacturer need not design and produce different devices. This is particularly beneficial when the manufacturer desires to test the demand for programmable devices of differing sizes. By adjusting signature bits 108, either by programming or by hardwiring the signature bits 108 during manufacture, different product lines may be quickly and easily produced. Thus, the manufacturer may test the demand for different sized programmable devices without incurring the costs of a new design. Moreover, use of a virtual programmable device permits the manufacturer to support any demand for smaller programmable devices almost immediately. A virtual programmable device may be sold for less than a programmable device having access to all the logic blocks, but that slight economic loss is made up by being able to test the market to see if it will support a dedicated product line of the differing size. Thus, the manufacturer may design and manufacture dedicated smaller programmable devices in a more leisurely fashion and only when it is assured that there is adequate demand for such a product line.

While the present invention has been described in connection with specific embodiments, one of ordinary skill in the art will recognize that various substitutions, modifications and combinations of the embodiments may be made after having reviewed the present disclosure. The specific embodiments described above are illustrative only. Various adaptations and modifications may be made without departing from the scope of the invention. For example, alternative types of signature bits may be used, including the use of fuses. The spirit and scope of the appended claims should not be limited to the foregoing description.

What is claimed is:

1. A programmable device comprising:

a plurality of logic blocks;

routing conductors for programmably interconnecting one or more logic blocks;

input/output pins coupled to said routing conductors; and at least one signature bit coupled to at least one of said input/output pins, said at least one signature bit indicating that said programmable device is a virtual device, wherein a virtual device has a number of logic blocks restricted from use.

2. The programmable device of claim 1, wherein said signature bit further indicates the location of said number logic blocks that are restricted from use.

3. The programmable device of claim 1, wherein said programmable device is a field programmable gate array.

4. The programmable device of claim 1, wherein said signature bit is programmable.

5. The programmable device of claim 4, wherein said signature bit comprises:

a transistor having a first terminal, a second terminal, and a third terminal, said first terminal coupled to a valid conductor, and said third terminal coupled to a signature conductor; and a programmable antifuse disposed between said second terminal of said transistor and a ground reference voltage.

6. The programmable device of claim 1, comprising a plurality of signature bits indicating that said programmable device is a virtual device.

7. The programmable device of claim 6, wherein said plurality of signature bits are configurable to indicate said programmable device is a different virtual device.

8. The programmable device of claim 6, wherein said signature bits may be programmed multiple times to indicate said programmable device is a different virtual device.

9. The programmable device of claim 8, wherein said signature bits may be programmed to indicate said programmable device is not a virtual device.

10. A method of altering the functional size of a programmable device, said programmable device having a plurality of logic blocks, a plurality of conductors, and a plurality of antifuses, said antifuses being programmable to interconnect selected conductors with selected logic blocks, said method comprising:

identifying a number of logic blocks that are restricted from use; and restricting said number of logic blocks from being programmed in said programmable device thereby making said number of said logic blocks inaccessible to a user.

11. The method of claim 10, further comprising:

displaying a model of said programmable device to a user, wherein said number of logic blocks that are restricted from use are not displayed in said model;

mapping a desired circuit onto the displayed model of said programmable device without using said number of logic blocks; and producing a mapped file with a part identifier.

12. The method of claim 11, wherein identifying a number of logic blocks that are restricted from use comprises:

examining the configuration of at least one signature bit on said programmable device; and matching said configuration with said part identifier.

13. The method of claim 12, wherein examining the configuration of at least one signature bit comprises determining if said at least one signature bit has been programmed.

14. A method of producing a programmable device, said method comprising:

manufacturing a programmable device with a plurality of logic blocks and at least one signature bit;

altering said at least one signature bit to indicate that said programmable device is a virtual device, wherein said virtual device has fewer than all the logic blocks accessible to a user.

15. The method of claim 14, wherein said altering said at least one signature bit comprises programming said signature bit with the desired configuration after manufacture of said programmable device.

16. A programmable device having at least one signature bit configured to indicate said programmable device is a virtual device, said programmable device comprising:

a plurality of logic blocks wherein a number of logic blocks are restricted from use when said at least one signature bit indicates said device is a virtual device;

routing conductors for programmably interconnecting one or more logic blocks; and input/output pins coupled to said routing conductors.

17. The programmable device of claim 16, wherein said signature bit further indicates the location of said number of logic blocks that are restricted from use.

18. The programmable device of claim 16, wherein said programmable device is a field programmable gate array.

19. The programmable device of claim 16, wherein said signature bit is programmable.

* * * * *